United States Patent [19]

Taguchi

[11] Patent Number: 5,585,157

[45] Date of Patent: Dec. 17, 1996

[54] PRINTED SUSBSTRATE HAVING REINFORCEMENT PATTERNS OF VARYING SIZE AND/OR SHAPE

[75] Inventor: Fumiya Taguchi, Yokohama, Japan

[73] Assignee: Nikon Corporation, Tokyo, Japan

[21] Appl. No.: 377,988

[22] Filed: Jan. 25, 1995

[30] Foreign Application Priority Data

Feb. 14, 1994 [JP] Japan .................................. 6-039235

[51] Int. Cl.⁶ ..................................................... B32B 9/00
[52] U.S. Cl. ........................... 428/63; 428/131; 428/209; 428/596; 174/166 R; 174/265
[58] Field of Search .................... 428/63, 131; 174/265, 174/166 R; 361/750

Primary Examiner—Patrick Ryan
Assistant Examiner—Cathy K. Lee

[57] ABSTRACT

A printed substrate having a structure to prevent breakage of the printed substrate by distributing stress which acts on a border of reinforcement patterns provided in the substrate. The printed substrate includes multiple layer conductive patterns, through-holes which pass through the conductive patterns and the printed substrate, and reinforcement patterns formed around the perimeters of the through-holes in the multiple layers of the printed substrate. The sizes and/or shapes of the reinforcement patterns in each layer differ such that stress acting on the border of the reinforcement pattern is distributed.

14 Claims, 3 Drawing Sheets

PRINTED SUSBSTRATE HAVING REINFORCEMENT PATTERNS OF VARYING SIZE AND/OR SHAPE

BACKGROUND OF THE INVENTION

1. Field of the Invention

The present invention relates to printed substrate, and, more particularly to a printed substrate having reinforcement patterns of different size and/or shape formed around through-holes in different layers of the printed substrate to distribute stress on the borders of the reinforcement patterns.

2. Description of the Related Art

Printed substrates, such as flexible printed substrates, having devices secured thereon are known. When devices are mounted on the flexible printed substrate, the relative positional relationship between the mounted devices and the flexible printed substrate is maintained by securing the devices with pins which pass through holes provided on the flexible printed substrate (hereinafter referred to as "through-holes"). Further, when inspecting a flexible printed substrate on which devices have been mounted, the flexible printed substrate is secured by passing pins through the through-holes provided in the flexible printed substrate to secure the relative position of electric terminal seats when inspecting for signal exposure using an inspection device probe. When securing the flexible printed substrate, the through-holes of the flexible printed substrate may be broken during the operations of installation or removal of the pins which secure the devices or the flexible printed substrate because there is a difference in the rigidity of the pins, which are made of metal, and the rigidity of the base material of the flexible printed substrate, which is made of a synthetic resin.

FIGS. 5A, 5B and 6 show a conventional flexible printed substrate 21 having a structure which prevents breakage of the flexible printed substrate 21. FIG. 5A is a view of a front surface of the flexible printed substrate 21. Circular reinforcement patterns 24 and 25 are formed around the perimeters of through-holes 22 and 23 and are concentric with through-holes 22 and 23, respectively. The reinforcement patterns 24, 25 are made of copper having a rigid strength which is close to the rigid strength of the pins (not shown) which are placed through the through-holes. FIG. 5B is a view of a back surface of flexible printed substrate 21 showing circular reinforcement patterns 26 and 27 formed around the perimeters of through-holes 22 and 23 and concentric with through-holes 22 and 23, respectively.

FIG. 6 is a partial cross-sectional diagram of the conventional flexible printed substrate 21 showing a region near through-hole 22. Circular reinforcement pattern 24 is formed on the front surface of the flexible printed substrate 21, and circular reinforcement pattern 26 is formed on the back surface of the substrate 21. Further, reinforcement patterns 24 and 26 have the same shape. Moreover, reinforcement patterns 24 and 26 and flexible printed substrate 21 are covered by protective cover films 28 and 29.

When providing circular reinforcement patterns 24 and 26 around the perimeters of through-holes 22 and 23, respectively, of the flexible printed substrate 21, the rigidity of the flexible printed substrate is raised to a great extent by making reinforcement patterns 24 and 26 the same shape on the front and back of the substrate 21. Instead of preventing breakage at the contact terminal surface of the pins and through-holes 22, 23, stress accumulates at a border between reinforcement patterns 24, 26 and the flexible printed substrate 21, and reinforcement patterns 24, 26 may pull off from the substrate 21 causing the substrate 21 to break. Pulling off of the reinforcement patterns frequently occurs when there is a big difference between the tensile strength of the reinforcement pattern around the through-holes and the tensile strength of the base material of the printed substrate (particularly with a flexible printed substrate).

SUMMARY OF THE INVENTION

Accordingly, it is an object of the present invention to provide a primed substrate having reinforcement patterns surrounding through-holes in the printed substrate.

It is another object of the present invention to provide a printed substrate having reinforcement patterns surrounding through-holes in the printed substrate which prevent breakage of the printed substrate by distributing the stress which acts at respective borders of the reinforcement patterns.

Additional objects and advantages of the invention will be set forth in part in the description which follows, and, in part, will be obvious from the description, or may learned by practice of the invention.

Objects and advantages of the present invention are achieved with a printed substrate on which multiple layers of conductive patterns are formed, the printed substrate having through-holes which pass through the conductive patterns and the printed substrate, and having reinforcement patterns which are formed around the perimeters of the through-holes in the multiple layers of the conductive patterns. In particular, a first reinforcement pattern is formed of a conductive material around a perimeter of a through-hole on a front surface of the printed substrate and a second reinforcement pattern is formed of a conductive material around a perimeter of a through-hole on a back surface of the printed substrate. The reinforcement pattern on the front surface has a different size and/or shape from the reinforcement pattern on the back surface.

The configuration described above prevents breakage of the printed substrate because the difference in the size and/or shape of the reinforcement patterns at each layer distributes the stress which acts on the boundary of the reinforcement patterns.

BRIEF DESCRIPTION OF THE DRAWINGS

These and other objects and advantages of the invention will become apparent and more readily appreciated from the following description of the preferred embodiments, taken in conjunction with the accompanying drawings of which.

DESCRIPTION OF THE PREFERRED EMBODIMENTS

Figure 1A:
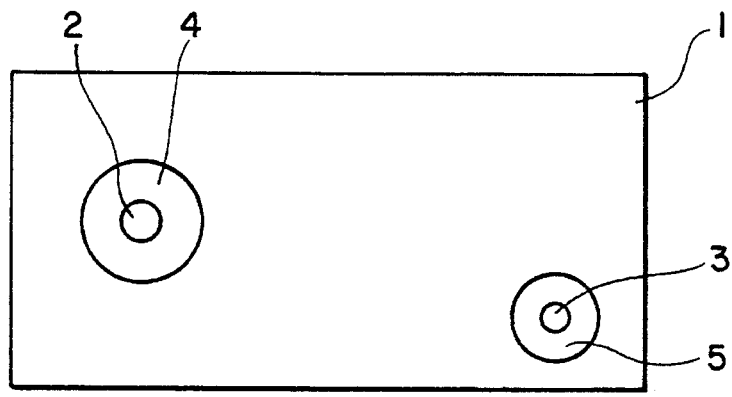
FIGS. 1A and 1B show a front surface and a back surface, respectively, of a printed substrate in accordance with a first embodiment of the present invention.

Reference will now be made in detail to the present preferred embodiments of the present invention, examples of which are illustrated in the accompanying drawings, wherein like reference numerals refer to like elements throughout.

Figure 1B:
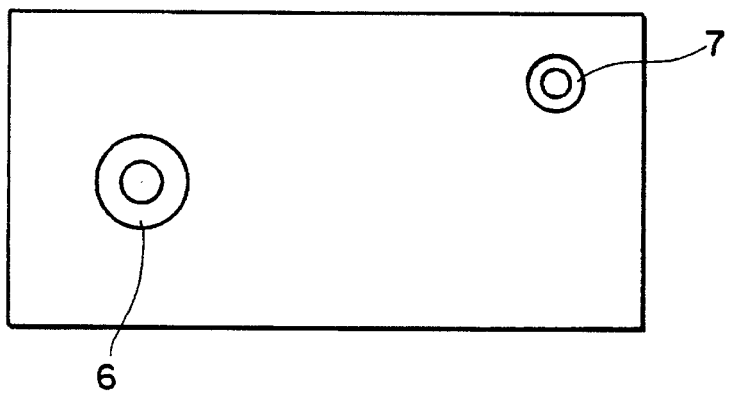

FIGS. 1A and 1B show a first embodiment of a printed substrate in accordance with the present invention. The printed substrate 1 is preferably a flexible printed substrate. FIG. 1A shows a front surface of printed substrate 1 having circular reinforcement patterns 4 and 5, which are preferably conductive patterns made of copper, formed around the perimeters of through-holes 2 and 3. The reinforcement patterns 4 and 5 have a circular shape and are concentric with through-holes 2 and 3, respectively. FIG. 1B shows a back surface of the printed substrate 1 having circular reinforcement patterns 6 and 7 formed around the perimeters of through-holes 2 and 3, respectively. The circular reinforcement patterns 6 and 7 are preferably conductive patterns made of copper and have a circular shape concentric with through-holes 2 and 3, respectively.

Figure 2:
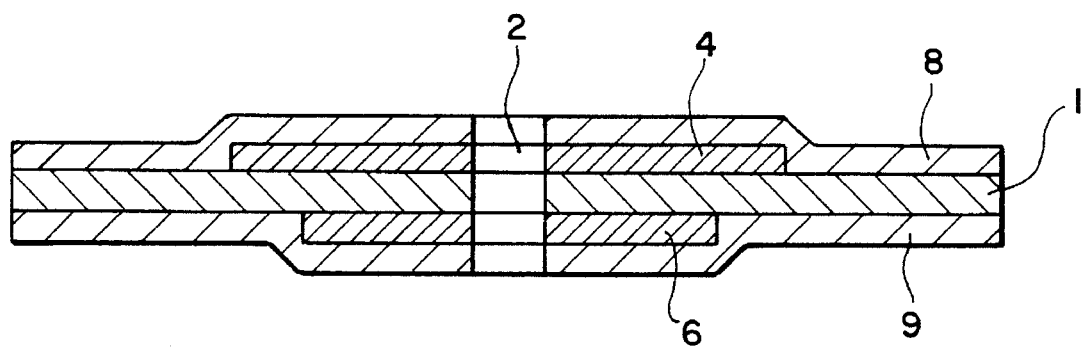
FIG. 2 is a partial cross-sectional view of a printed substrate in accordance with the first embodiment of the present invention.

FIG. 2 is a partial cross-sectional diagram of the printed substrate 1 of FIG. 1 showing the region around through-hole 2. The circular reinforcement patterns 4 and 6 may be formed on the front and back sides, respectively, of the printed substrate 1 by etching or like methods. As can be seen in FIG. 2, the circular reinforcement patterns 4 and 6 have differing sizes. Specifically, the diameter (or width) of circular reinforcement pattern 6 is narrow relative to the diameter (or width) of circular reinforcement pattern 4. In addition, reinforcement patterns 4 and 6 as well as the printed substrate 1 are covered by protective cover films 8 and 9.

By using circular reinforcement patterns 4 and 6 have differing sizes on the front and back of the printed substrate 1, the stress on the border between the reinforcement patterns and the printed substrate 1 can be distributed, and breakage of the printed substrate 1 can be prevented.

Figure 3A:
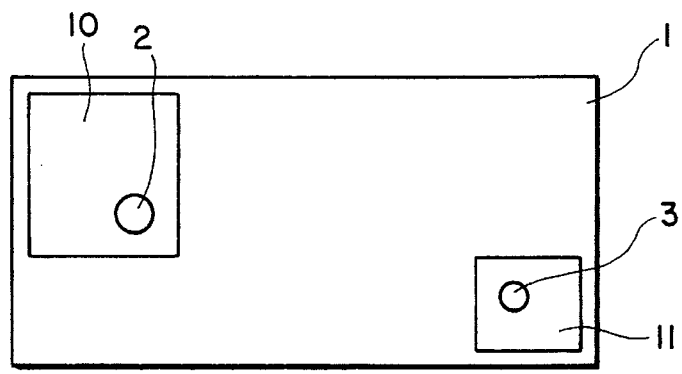
FIGS. 3A and 3B show a front surface and a back surface, respectively, of a printed substrate in accordance with a second embodiment of the present invention.
Figure 3B:
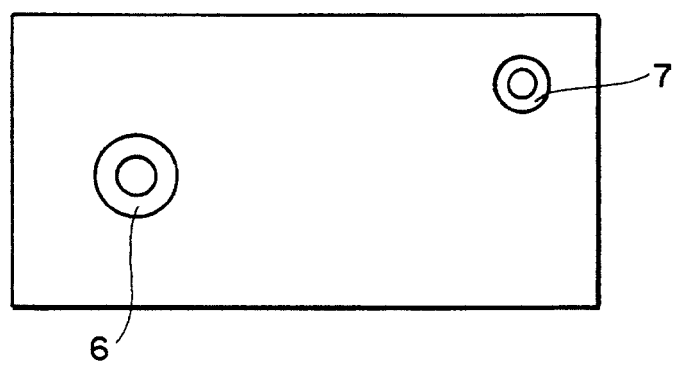

FIGS. 3A and 3B show a second embodiment of a printed substrate in accordance with the present invention. FIG. 3A shows a front surface and FIG. 3B shows a back surface of the printed substrate. The elements which are the same as those shown in FIG. 1 and FIG. 2 are referred to by the same reference numerals, and an explanation of these like elements will not be repeated here.

In accordance with the second embodiment, rectangular reinforcement patterns 10 and 11 are formed, preferably of conductive patterns made of copper, for example, by etching on the front surface of the printed substrate 1. Circular reinforcement patterns 6 and 7 are formed on the back surface of printed substrate 1 in the same manner as described above with reference to the first embodiment. The positioning of the rectangular reinforcement patterns 10 and 11 differs from the positioning of the circular reinforcement patterns on the front surface of the printed substrate 1 as described with respect to the first embodiment. More specifically, whereas the circular reinforcement patterns shown in FIG. 1 are concentric with the through-holes, the rectangular reinforcement patterns 10 and 11 are arranged such that the through-holes 2 and 3 are not at the center of the rectangular reinforcement patterns. In the above-described manner, when rectangular and circular reinforcement patterns are formed on the front and back, respectively, of printed substrate 1, the stress on the border between the reinforcement patterns and the printed substrate can be distributed, and breakage of the printed substrate can be prevented.

Figure 4A:
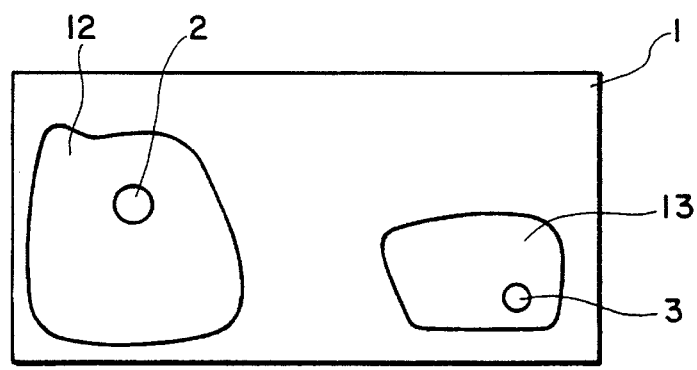
FIGS. 4A and 4B show a front surface and a back surface, respectively, of a printed substrate in accordance with a third embodiment of the present invention.
Figure 4B:
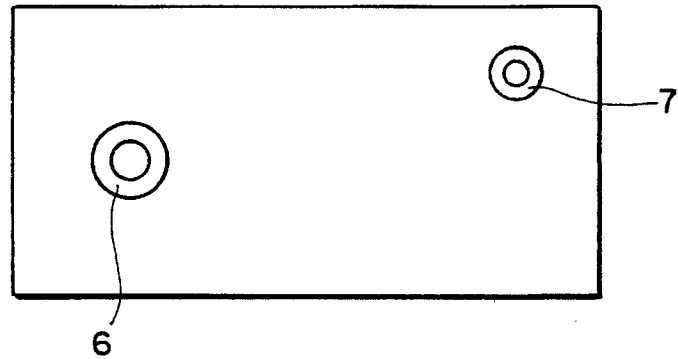
Figure 5A:
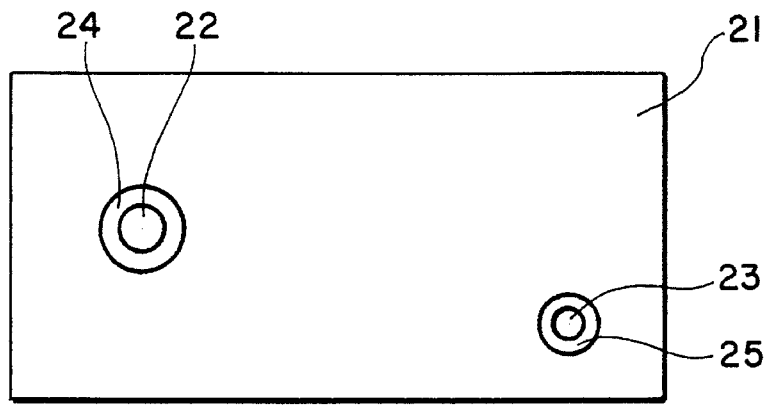
FIGS. 5A and 5B show an example of a front surface and a back surface, respectively, of a conventional printed substrate.
Figure 5B:
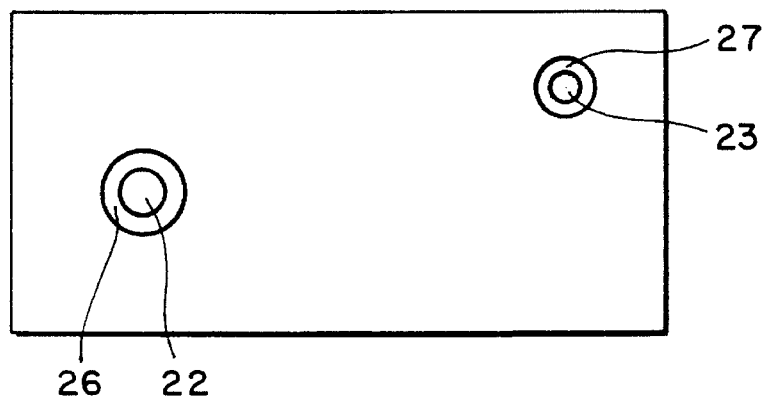
Figure 6:
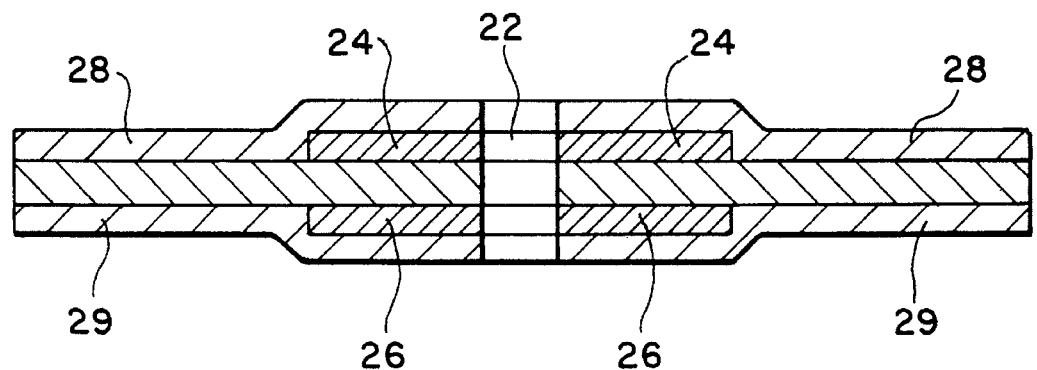
FIG. 6 is a partial cross-sectional view of a conventional printed substrate.

FIGS. 4A and 4B show a third embodiment of a printed substrate in accordance with the present invention. FIG. 4A shows a front surface of the printed substrate and FIG. 4B shows a back surface of the printed substrate. The elements which are the same as those shown in FIG. 1 and FIG. 2 are referred to by the same reference numerals, and explanations of the like elements will not be repeated here.

In accordance with the third embodiment of the invention, "cloud"-shaped or irregular-shaped reinforcement patterns 12 and 13 are formed, preferably of conductive patterns made of copper, by etching on the front surface of the printed substrate 1. Circular reinforcement patterns 6 and 7 are formed on the back surface of the printed substrate 1 in the same manner as described with reference to FIG. 1 of the first embodiment. The positioning of the cloud shaped or irregular shaped reinforcement patterns 12 and 13 differs from the positioning of the circular reinforcement patterns on the front surface of the printed substrate 1 described with respect to the first embodiment. Specifically, the through-holes are not located at the centers of the cloud-shaped reinforcement patterns 12 and 13. In this 10 manner, the cloud shaped and circular shaped reinforcement patterns on the front and back, respectively, of printed substrate 1 distribute the stress on the border between the reinforcement patterns and the printed substrate, and breakage of the printed substrate can be prevented.

In the embodiments described above, the printed substrate is preferably a flexible printed substrate. However, embodiments of the present invention are not limited to a flexible printed substrate, and may be applied to an ordinary printed substrate. Furthermore, the present invention may also be applied to a multi-layered printed substrate on which multiple layer conductive patterns are formed. In addition, the reinforcement patterns explained above in accordance with embodiments of the present invention can be formed with routing lands (conductive patterns) by providing the reinforcement patterns and routing lands with the same configurations in differing locations on the printed substrate, such that the reinforcement patterns and lands can be formed (manufactured) simultaneously.

According to the embodiments of the present invention described above, because the reinforcement patterns have a size and/or shape which are different in respective layers on a front surface and a back surface of a printed substrate, the stress which acts on the border of the reinforcement patterns can be distributed, and breakage of the printed substrate can be prevented.

Although a few preferred embodiments of the present invention have been shown and described, it would be appreciated by those skilled in the an that changes may be made in these embodiments without departing from the principles and spirit of the invention, the scope of which is defined in the claims and their equivalents.

What is claimed is:

1. A printed substrate, comprising;

a substrate a through-hole passing through the substrate; and a multiple layer conductive reinforcement pattern formed around a perimeter of the through-hole, wherein the respective layers of the multiple layer conductive reinforcement pattern have at least one of a different size and a different shape.

2. A printed substrate as recited in claim 1, wherein the through-hole is for position determination.

3. A printed substrate as recited in claim 1, wherein the multiple layer conductive reinforcement pattern comprises a first circular reinforcement pattern in a first layer and a second circular reinforcement pattern in a second layer, wherein a diameter of the first circular reinforcement pattern is different from the diameter of the second circular reinforcement pattern.

4. A printed substrate as recited in claim 1, wherein the multiple layer conductive reinforcement pattern comprises a rectangular shaped conductive reinforcement pattern in a first layer and a circular shaped conductive reinforcement pattern in a second layer.

5. A printed substrate as recited in claim 1, wherein the multiple layer conductive reinforcement pattern comprises an irregular shaped conductive reinforcement pattern in a first layer and rectangular shaped conductive reinforcement pattern in a second layer.

6. A printed substrate, comprising:

a substrate;

a through-hole passing through the substrate;

a first reinforcement pattern surrounding a perimeter of the through-hole formed on a front surface of the substrate; and a second reinforcement pattern surrounding a perimeter of the through-hole formed on a back surface of the substrate, wherein the first reinforcement pattern has at least one of a different size and shape from the second reinforcement pattern.

7. A printed substrate as recited in claim 6, wherein the first and second reinforcement patterns are each circular shaped and concentric with the through-hole, and the first reinforcement pattern has a larger diameter than the second reinforcement pattern.

8. A printed substrate as recited in claim 6, wherein the first reinforcement pattern is rectangular and the second reinforcement pattern is circular.

9. A printed substrate as recited in claim 8, wherein the first reinforcement pattern surrounds the through-hole such that the through-hole is off-center with respect to the first reinforcement pattern and the second reinforcement pattern is concentric with the through-hole.

10. A printed substrate as recited in claim 6, wherein the first reinforcement pattern is irregular shaped and the second reinforcement pattern is circular shaped.

11. A printed substrate as recited in claim 10, wherein the first reinforcement pattern surrounds the through-hole such that the through-hole is off-center with respect to the reinforcement pattern and the second reinforcement pattern is concentric with the through-hole.

12. A printed substrate as recited in claim 6, wherein the first and second reinforcement patterns are conductive patterns made of copper.

13. A printed substrate as recited in claim 6, wherein the substrate is a flexible printed substrate.

14. A printed substrate as recited in claim 13, wherein the first and second reinforcement patterns are conductive patterns made of copper.

* * * * *